(12) United States Patent
Yu et al.

(10) Patent No.: US 10,020,211 B2
(45) Date of Patent: Jul. 10, 2018

(54) WAFER-LEVEL MOLDING CHASE DESIGN

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW); Hui-Min Huang, Taoyuan (TW); Chih-Fan Huang, Kaoshung (TW); Ming-Da Cheng, Jhubei (TW); Meng-Tse Chen, Changzhi Township (TW); Bor-Ping Jang, Chu-Bei (TW); Chien Ling Hwang, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 751 days.

(21) Appl. No.: 14/302,697

(22) Filed: Jun. 12, 2014

(65) Prior Publication Data
US 2015/0364456 A1    Dec. 17, 2015

(51) Int. Cl.
| H01L 25/00 | (2006.01) |
| H01L 25/065 | (2006.01) |
| B29C 45/14 | (2006.01) |
| H01L 21/66 | (2006.01) |
| B29C 45/77 | (2006.01) |
| B29C 45/20 | (2006.01) |

(Continued)

(52) U.S. Cl.
CPC .... H01L 21/67126 (2013.01); B29C 45/0046 (2013.01); B29C 45/02 (2013.01); B29C 45/34 (2013.01); H01L 21/561 (2013.01); H01L 21/565 (2013.01); H01L 24/18 (2013.01); H01L 24/96 (2013.01); B29C 45/14655 (2013.01); B29C 45/14836 (2013.01); B29C 2045/0049 (2013.01); B29C 2045/14663 (2013.01); B29L 2031/34 (2013.01); H01L 2224/16225 (2013.01); H01L 2924/18161 (2013.01)

(58) Field of Classification Search
CPC .............. B29C 45/34; B29C 45/14655; B29C 45/14836; B29C 2045/0049; B29C 2045/14663; B29C 45/0046; B29C 45/02
See application file for complete search history.

(56) References Cited

U.S. PATENT DOCUMENTS 2,499,565 A * 3/1950 Booth ................ B29D 35/0018
249/109
3,052,925 A * 9/1962 Bronnenkant .......... B29C 45/23
264/328.17

(Continued)

FOREIGN PATENT DOCUMENTS

CN         1378254 A     11/2002
CN       101170070 A      4/2008
(Continued)

*Primary Examiner* — Alison L Hindenlang
*Assistant Examiner* — Emmanuel S Luk
(74) *Attorney, Agent, or Firm* — Slater Matsil, LLP (57) ABSTRACT

An apparatus includes a mold chase, which includes a top portion and an edge ring having a ring-shape. The edge ring is underlying and connected to an edge of the top portion. The edge ring has an injection port and a venting port. A molding guide kit is configured to be inserted into the injection port. The molding guide kit includes a front sidewall having a curved front edge.

20 Claims, 12 Drawing Sheets

(51) Int. Cl.
  *H01L 21/67* (2006.01)
  *H01L 21/56* (2006.01)
  *B29C 45/34* (2006.01)
  *B29C 45/00* (2006.01)
  *B29C 45/02* (2006.01)
  *H01L 23/00* (2006.01)
  *B29L 31/34* (2006.01)

(56) References Cited

U.S. PATENT DOCUMENTS

| | | | | |
|---|---|---|---|---|
| 4,044,984 | A * | 8/1977 | Shimizu | B29C 33/0044 249/83 |
| 4,822,269 | A * | 4/1989 | Kamiyama | B29C 45/20 264/102 |
| 4,861,251 | A * | 8/1989 | Moitzger | B29C 33/18 249/119 |
| 4,862,586 | A * | 9/1989 | Osada | B29C 45/14655 257/E21.504 |
| 4,915,607 | A * | 4/1990 | Medders | B29C 45/02 174/250 |
| 5,133,921 | A * | 7/1992 | Yokoyama | B29C 45/14073 257/E21.504 |
| 5,196,917 | A * | 3/1993 | Ueda | H01L 23/48 257/666 |
| 5,275,546 | A * | 1/1994 | Fierkens | B29C 45/14655 249/95 |
| 5,293,065 | A * | 3/1994 | Chan | H01L 21/565 257/666 |
| 5,316,463 | A * | 5/1994 | Neu | B29C 45/14655 249/95 |
| 5,409,362 | A * | 4/1995 | Neu | B29C 45/14655 249/95 |
| 5,517,056 | A * | 5/1996 | Bigler | H01L 21/565 257/666 |
| 5,589,202 | A * | 12/1996 | Okano | B29C 44/58 425/129.1 |
| 5,684,327 | A * | 11/1997 | Nakazawa | H01L 21/565 257/667 |
| 5,723,156 | A | 3/1998 | Matumoto | |
| 5,766,987 | A * | 6/1998 | Mitchell | H01L 21/565 257/E21.504 |
| 5,886,398 | A * | 3/1999 | Low | H01L 21/565 257/667 |
| 5,964,030 | A * | 10/1999 | Lee | H01L 21/565 257/E21.504 |
| 5,981,873 | A * | 11/1999 | Heo | H01L 21/565 174/522 |
| 6,139,304 | A * | 10/2000 | Centofante | B29C 45/14311 257/E21.504 |
| 6,206,336 | B1 * | 3/2001 | Espie | B29C 33/10 249/141 |
| 6,245,595 | B1 * | 6/2001 | Nguyen | H01L 21/563 228/180.22 |
| 6,319,450 | B1 * | 11/2001 | Chua | B29C 45/14655 257/787 |
| 6,469,369 | B1 * | 10/2002 | Lee | H01L 21/565 257/670 |
| 6,550,484 | B1 * | 4/2003 | Gopinath | H01L 21/67126 134/1.2 |
| 6,627,976 | B1 * | 9/2003 | Chung | H01L 21/565 257/666 |
| 6,897,093 | B2 * | 5/2005 | Kasuga | H01L 21/565 257/666 |
| 7,021,924 | B2 * | 4/2006 | Oyama | B29C 45/1781 264/328.7 |
| 7,368,818 | B2 * | 5/2008 | Kovac | H01L 21/56 257/735 |
| 7,393,489 | B2 * | 7/2008 | Cho | H01L 21/565 257/E21.504 |
| 7,863,109 | B2 * | 1/2011 | Chow | H01L 21/568 257/730 |
| 8,044,507 | B2 | 10/2011 | Matsumoto | |
| 8,349,661 | B2 * | 1/2013 | Okada | H01L 21/565 438/124 |
| 8,951,037 | B2 * | 2/2015 | Jang | B29C 45/34 425/546 |
| 9,030,000 | B2 * | 5/2015 | Eu | H01L 23/3128 257/692 |
| 9,768,038 | B2 * | 9/2017 | Lin | H01L 21/568 |
| 9,893,044 | B2 * | 2/2018 | Jang | H01L 25/50 |
| 2007/0132145 | A1 * | 6/2007 | Klobucar | B29C 45/2711 264/328.1 |
| 2007/0235897 | A1 * | 10/2007 | Brunnbauer | B29C 45/14639 264/272.13 |
| 2007/0281077 | A1 * | 12/2007 | Hock | H01L 21/565 427/98.6 |
| 2008/0284066 | A1 * | 11/2008 | Kuan | B29C 45/14655 264/571 |
| 2012/0119390 | A1 | 5/2012 | Oratti Kalandar et al. | |
| 2012/0175812 | A1 * | 7/2012 | Ikeda | B29C 33/68 264/272.13 |
| 2012/0178220 | A1 | 7/2012 | Okada et al. | |
| 2012/0187568 | A1 * | 7/2012 | Lin | H01L 21/76898 257/774 |
| 2012/0299168 | A1 * | 11/2012 | Kim | H01L 23/49827 257/668 |
| 2012/0319245 | A1 * | 12/2012 | Low | H01L 21/565 257/618 |
| 2013/0115735 | A1 * | 5/2013 | Chen | B29C 43/18 438/108 |
| 2013/0147054 | A1 * | 6/2013 | Lin | H01L 24/96 257/774 |
| 2013/0228951 | A1 | 9/2013 | Jang et al. | |
| 2014/0091483 | A1 | 4/2014 | Akiba et al. | |
| 2014/0291881 | A1 * | 10/2014 | Jang | B29C 45/34 264/102 |
| 2015/0170942 | A1 * | 6/2015 | Chhatre | H01L 21/70 29/450 |
| 2016/0064267 | A1 * | 3/2016 | Toh | H01L 21/68757 156/345.48 |
| 2016/0368177 | A1 * | 12/2016 | Kasai | B29C 33/68 |
| 2017/0278723 | A1 * | 9/2017 | Lin | H01L 24/96 |

FOREIGN PATENT DOCUMENTS

| | | |
|---|---|---|
| CN | 102453772 A | 5/2012 |
| JP | H10202644 A | 8/1998 |
| JP | 2012146799 A | 8/2012 |
| KR | 0163525 B1 | 2/1999 |
| TW | 502409 B | 9/2002 |
| TW | 200418152 A | 9/2004 |
| TW | 201304124 A | 1/2013 |
| TW | 201415561 A | 4/2014 |

* cited by examiner

WAFER-LEVEL MOLDING CHASE DESIGN

BACKGROUND

In the packaging of integrated circuits, package components such as device dies and package substrates are typically stacked through flip-chip bonding. To protect the stacked package components, a molding compound is dispensed surrounding the device die.

The conventional molding methods include compression molding and transfer molding. Compression molding may be used for over-molding. Since the compression molding cannot be used to fill the gaps between the stacked dies, the underfill needs to be dispensed in steps separate from the compression molding. On the other hand, transfer molding may be used to fill a molding underfill into the gap between, and over, the stacked package components. Accordingly, transfer molding may be used to dispense the underfill and the molding compound in the same step. The transfer molding, however, cannot be used on the packages including round wafers due to non-uniform dispensing of the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An apparatus for wafer-level transfer molding process and the method of performing the wafer-level transfer molding are provided in accordance with various exemplary embodiments of the present disclosure. The variations of the embodiments are discussed. Throughout the various views and illustrative embodiments, like reference numbers are used to designate like elements.

Figure 1:
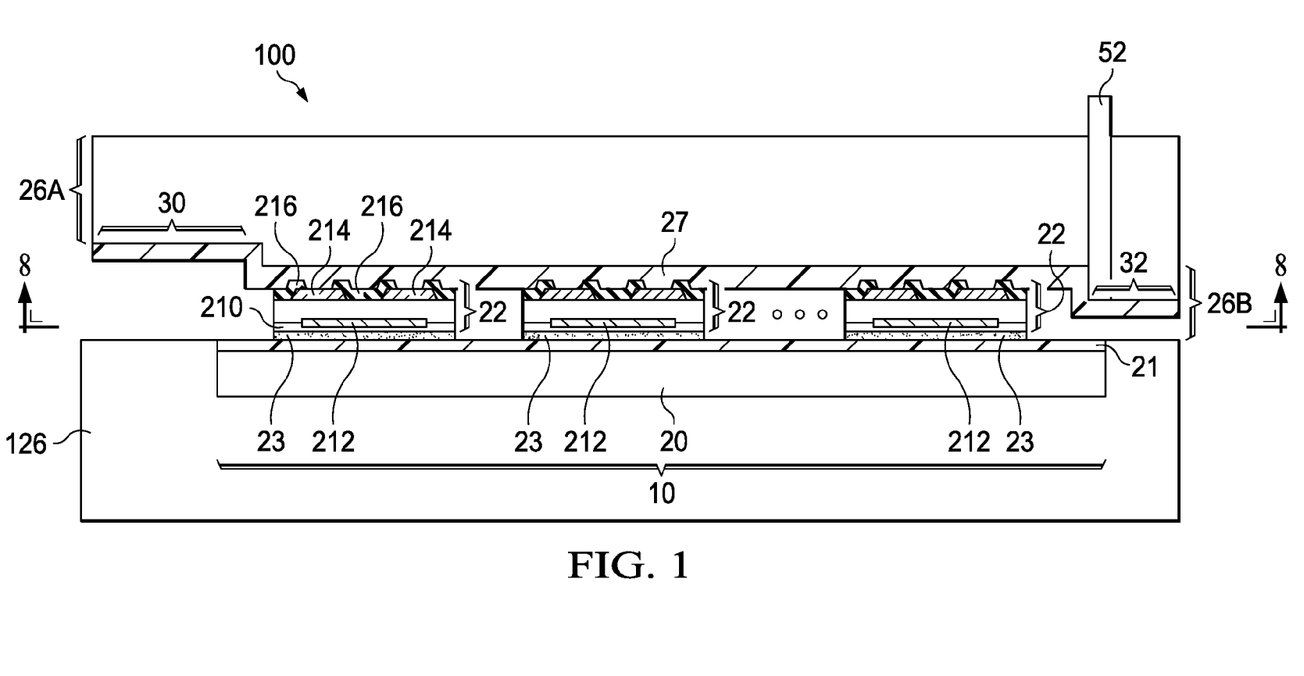
FIGS. 1 through 5 illustrate the cross-sectional views of intermediate stages in a wafer-level transfer molding process in accordance with some embodiments.

FIGS. 1 through 5 illustrate the cross-sectional views of intermediate stages in a wafer-level molding process in accordance with some embodiments. FIG. 1 illustrates a cross-sectional view of a part of a wafer-level transfer molding apparatus 100 in accordance with some embodiments of the present disclosure. Referring to FIG. 1, package structure 10 is placed in mold chase 26. Package structure 10 includes carrier 20 and dies 22 placed over carrier 20. In accordance with some embodiments, carrier 20 is made of glass, ceramic, silicon, organic materials such as plastics, or other materials. When made of silicon, carrier 20 may be a blank silicon wafer with no active devices and passive devices formed thereon.

Device dies 22 include active devices such as transistors therein. In accordance with some embodiments, device dies 22 are logic dies, which may be Central Processing Units (CPUs), Graphic Processing Units (GPUs), memory dies such as Static Random Access Memory (SRAM) dies, Dynamic Random Access Memory (DRAM) dies, or the like. In accordance with some embodiments, device dies 22 includes semiconductor substrates 210 and active devices 212 at the surface of semiconductor substrates 210. Electrical connectors 214 are formed at the top surface of device dies 22. In some embodiments, electrical connectors 214 are metal pads such as aluminum copper pads or metal pillars such as copper pillars. Surface dielectric layers 216 are also formed at the surfaces of device dies 22, with electrical connectors 214 exposed through surface dielectric layers 216.

Over carrier 20 may reside polymer layer 21, which is used as a buffer layer for placing device dies 22 thereon. Furthermore, Device-Attachment Films (DAFs) 23 are placed over polymer layer 21. Device dies 22 are attached to polymer layer 21 through DAFs 23, which may be adhesive films.

Figure 8:
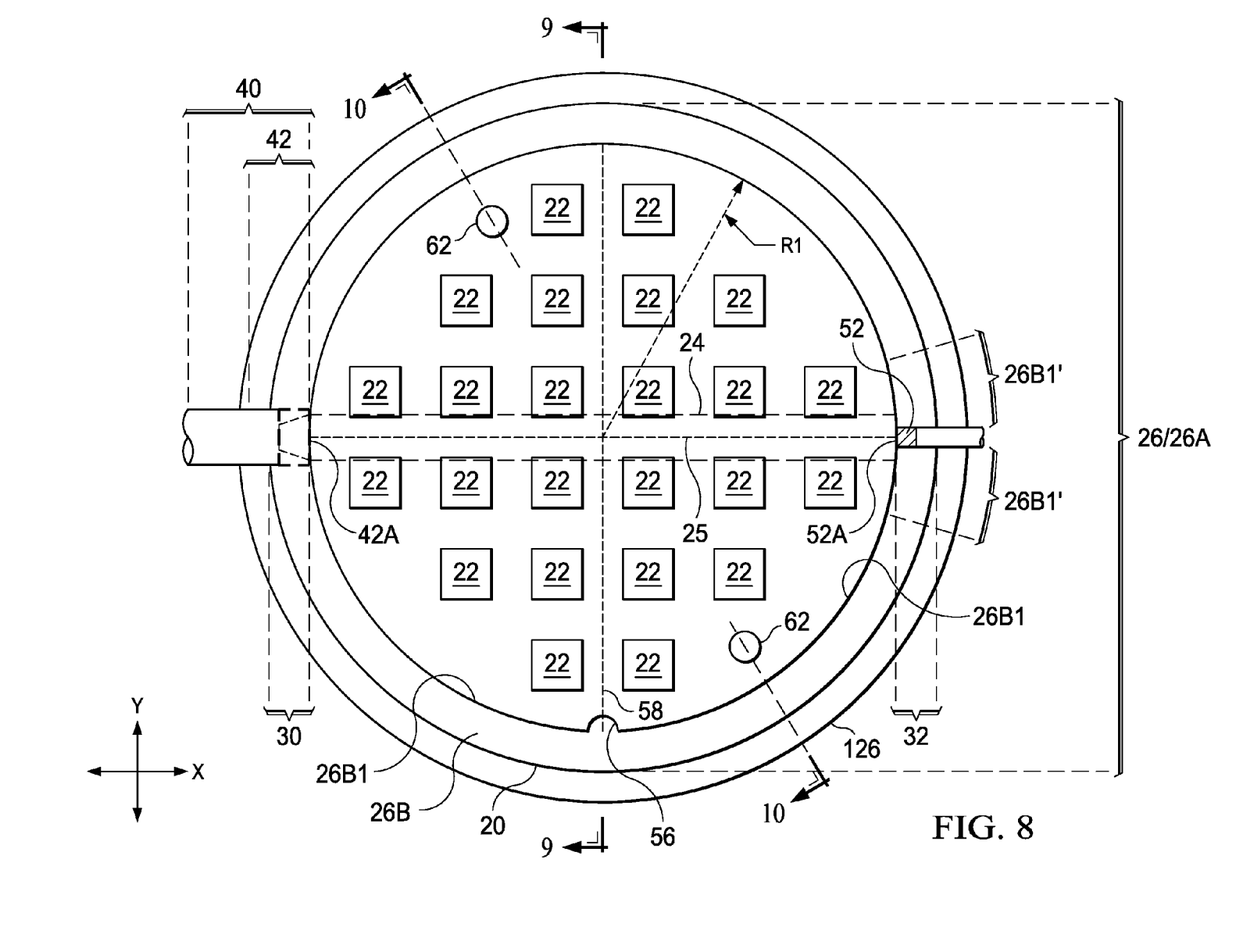
FIG. 8 illustrates the top view of an intermediate stage in a wafer-level transfer molding process in accordance with some embodiments.

Wafer-level transfer molding apparatus 100 includes mold chase 26 that further includes top portion (a cover) 26A, which may have a round top-view shape (FIG. 8). As shown in FIG. 1, release film 27, which is made of a flexible material, is attached to the inner surface of mold chase 26. The top surfaces of dies 22 are in contact with the bottom surface of release film 27. Accordingly, there is no space left over at the top surfaces of dies 22. Furthermore, release film 27 may be pressed against surface dielectric layers 216 of device dies 22 and possibly electrical connectors 214. Accordingly, electrical connectors 214 are protected by release film 27 so that in the subsequent molding process, no molding compound covers electrical connectors 214. This advantageously reduces the manufacturing cost since no grinding is needed to expose electrical connectors 214 in subsequent steps when redistribution lines are formed over device dies 22 to electrically couple to electrical connectors 214.

Release film 27 may or may not extend to the inner sidewalls of mold chase 26 in accordance with some embodiments. On the other hand, the gaps between neighboring dies 22 remain unfilled by release film 27. Accordingly, in the subsequent molding process, the dispensed molding compound flows through the gaps between neighboring device dies 22 but not over device dies 22.

Mold chase 26 further includes edge ring 26B (also refer to FIGS. 9 and 10), which encircles dies 22. Edge ring 26B is connected to, and extends down from, the edges of top portion 26A of mold chase 26. Edge ring 26B encircles a region underlying top portion 26A, wherein the region is referred to as the inner space of mold chase 26 hereinafter. Accordingly, device dies 22 and release film 27 are located in the inner space of mold chase 26. Mold chase 26 may be formed from aluminum, stainless steel, ceramic, or the like. The bottom ends of edge ring 26B may be in contact with the top surface of carrier 20 so that the inner space of mold chase 26 is sealed. Alternatively, the bottom ends of edge ring 26B are pressed against release film 27, which is also pressed against the underlying mold chase 126.

In some embodiments, as shown in FIG. 1, mold chase 126, which is a lower mold chase, is placed under mold chase 26. Mold chases 26 and 126 may be used in combination for molding package structure 10. Lower mold chase 126 may not used in some other embodiments. In these embodiments, the bottom edge of edge ring 26B is placed against the edge portions of carrier 20.

FIG. 8 illustrates a top view of wafer-level transfer molding apparatus 100 in accordance with some embodiments, wherein the top-view is obtained from the horizontal plane containing line 8-8 in FIG. 1. As shown in FIG. 8, carrier 20 has a circular (round) top-view shape. Dies 22 are arranged as a plurality of rows and columns separated by gaps (streets) that also extend in X and Y directions, which are perpendicular to each other. A central street 24 is aligned to diameter 25 of carrier 20. Accordingly, the streets (in the X-direction) that are on the opposite sides of and parallel to central street 24 are shorter than central street 24.

FIG. 8 further illustrates injection port 30 and venting port 32, which are on opposite sides of mold chase 26. In accordance with some embodiments, injection port 30 and venting port 32 are aligned to, and are connected to, opposite ends of central street 24. Injection port 30 and venting port 32 include openings on edge ring 26B of mold chase 26.

Figure 7A:
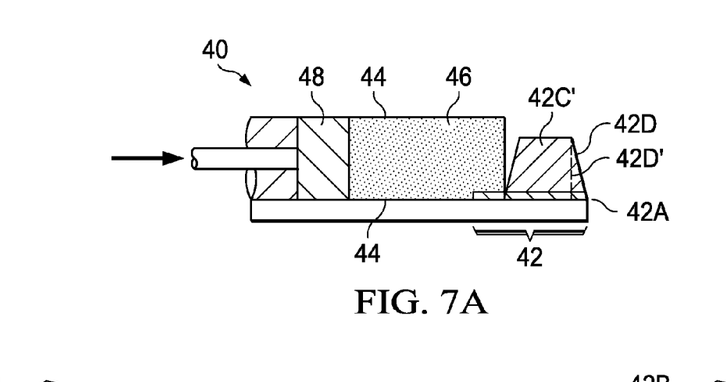
FIGS. 7A, 7B, and 7C illustrate a cross-sectional view and perspective views of various molding compound dispensing kits in accordance with some embodiments.
Figure 7B:
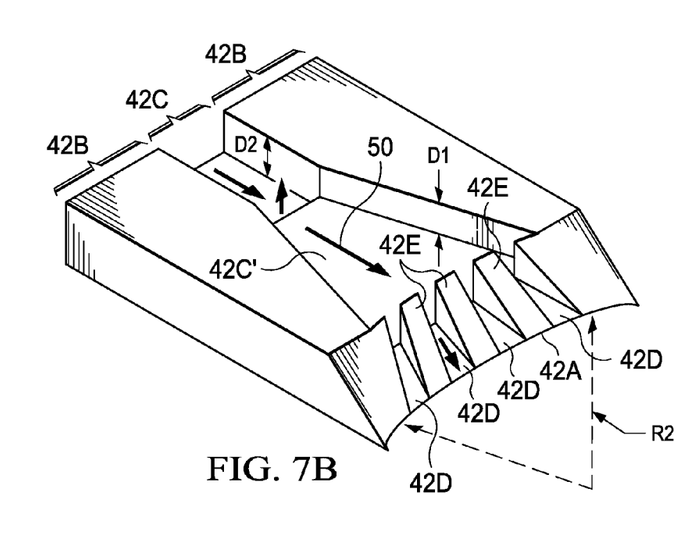
Figure 7C:
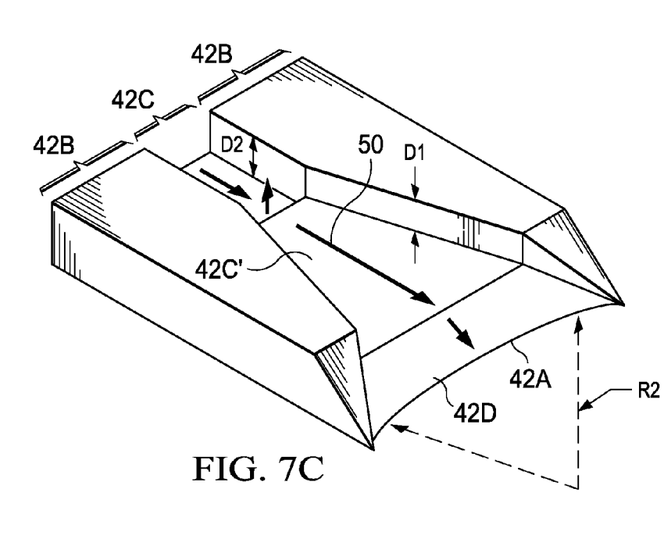

The injection of molding compound in accordance with the embodiments of the present disclosure is performed using a molding compound dispensing kit, as illustrated in FIGS. 7A, 7B, and 7C. FIG. 7A illustrates a cross-sectional view of molding compound dispensing kit 40 in accordance with some exemplary embodiments. Molding compound dispensing kit 40 may include molding guide kit 42 at the front end, storage 44 behind molding guide kit 42, and piston 48 that is configured to move in storage 44. Storage 44 may be a pipe in some embodiments. Molding material 46 is placed in storage 44 before the molding process starts. In accordance with some embodiments, molding material 46 is a solid that is heated to become a fluid before the molding process begins. In alternative embodiments, molding material 46 is a fluid and is injected into storage 44 before the molding process begins.

FIG. 7B illustrates a perspective view of molding guide kit 42 in accordance with some embodiments. Molding guide kit 42 may include edge portions 42B, which form dams on opposite sides and leave a channel 42C therebetween. The bottom of the channel 42C has top surface 42C', which is raised over the top surface of storage 44 (FIG. 7A). During the injection of molding material 46, molding material 46 flows in the direction as shown by arrow 50. For example, molding material 46 first flows upwardly over top surface 42C' and then downwardly through front sidewall 42D of molding guide kit 42. Front sidewall 42D may be slanted in some embodiments, wherein the slant sidewall 42D is not perpendicular to the top surfaces of edge portions 42B. In alternative embodiments, front sidewall 42D is a vertical edge perpendicular to the top surfaces of edge portions 42B. In these embodiments, the vertical front edge is also the front sidewall. The vertical front sidewall is schematically illustrated in FIG. 7A using a dashed line marked as 42D'.

The front sidewall 42D has front edge 42A, which is curved. Furthermore, as shown in FIG. 8, when molding guide kit 42 is inserted into injection port 30 of mold chase 26, front edge 42A forms a part of the circle of the inner edge 26B1 (also refer to FIGS. 10 and 11) of edge ring 26B (of mold chase 26) to make a circle. In accordance with some embodiments, the curvature and the radius R2 (FIGS. 7B and 7C) of front edge 42A are substantially equal to the respective curvature and radius R1 (FIG. 8) of inner edge 26B1 of edge ring 26B. For example, the difference between radius R1 and R2 is smaller than both radiuses R1 and R2.

FIG. 7B illustrates a multi-runner molding guide kit 42, wherein at the front end, a plurality of separators 42E are raised up from slant sidewall 42D to split the channel (for molding compound to flow through) into a plurality of sub-channels. FIG. 7C illustrates an alternative embodiment in which there is a single channel and no separators are formed.

As shown in FIGS. 7B and 7C, the channel of multi-runner molding guide kit 42 includes a shallow portion having depth D1 and a deeper portion with depth D2, whose value is greater than D1. The deeper portion is connected to the shallow portion, with the shallow portion between the deeper portion and the inner space of mold chase 26 (FIG. 8). Depth D1 is designed so that after the molding process the portion of molding compound with thickness equal to D1 can be easily broken.

Figure 2:
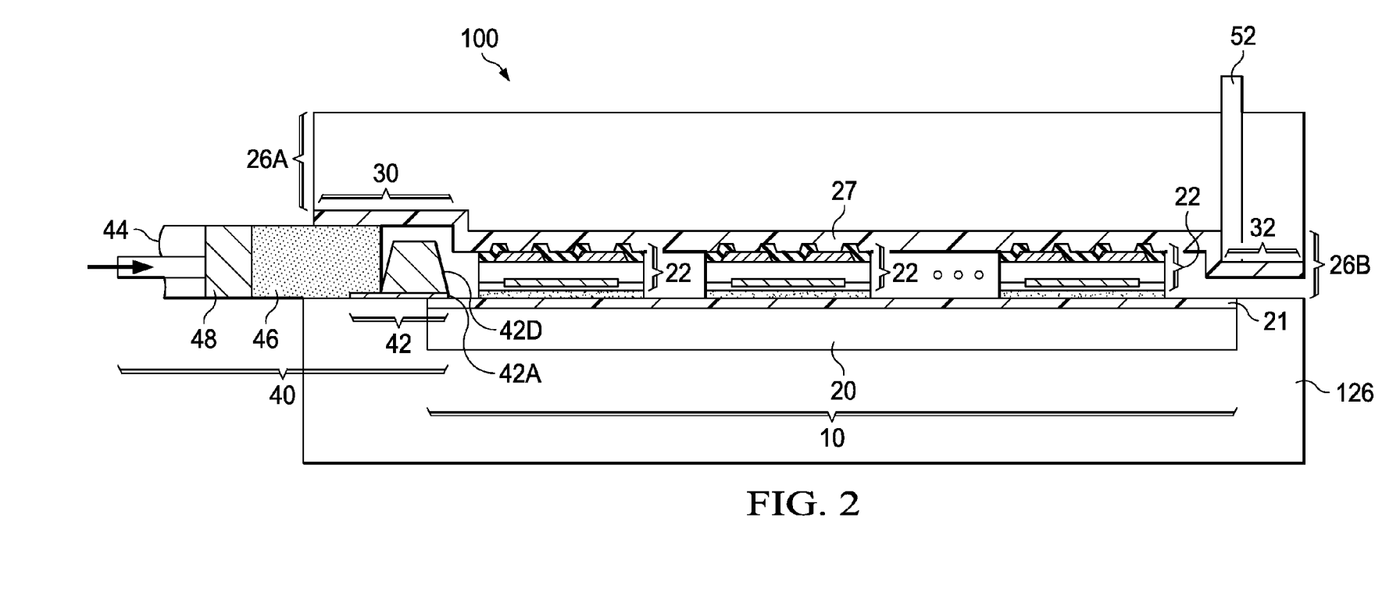
Figure 4:
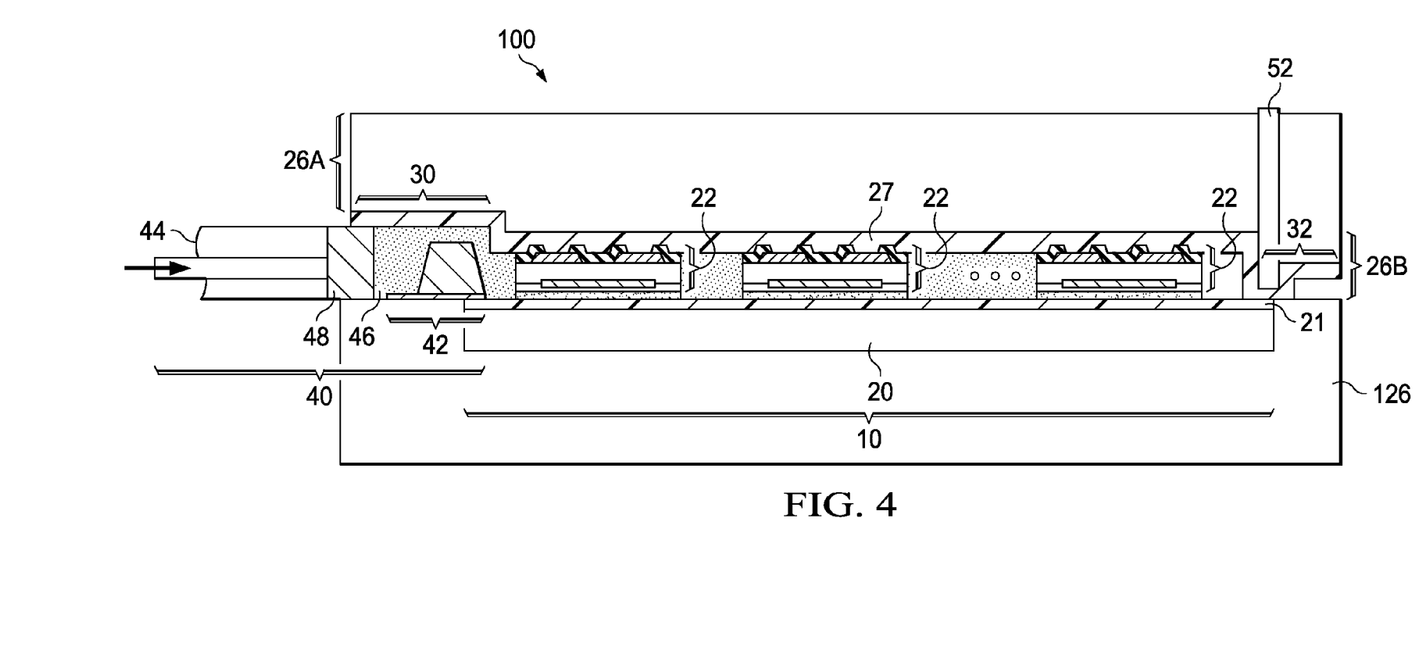

FIG. 8 also illustrates venting blocker 52 located at venting port 32. Venting blocker 52 is designed to be able to be lifted up (as shown in FIG. 2) and pushed down (as shown in FIG. 4). At the lifted-up position, venting blocker 52 does not block venting port 32, and hence air can be vacuumed from the inner space of mold chase 26. At the pushed-down position, venting blocker 52 blocks venting port 32 to prevent molding compound from flowing out through venting port 32. As shown in FIG. 8, venting blocker 52 has inner sidewall 52A, which may be curved or straight when viewed in the top view as shown in FIG. 8. In accordance with some embodiments of the present disclosure, inner sidewall 52A forms a part of the circle of the inner edge 26B1 (also refer to FIGS. 9 and 10) of edge ring 26B (of mold chase 26). In accordance with some exemplary embodiments, the curvature and the radius of inner sidewall 52A are equal to the respective curvature and radius R1 of inner edge 26B1 of edge ring 26B (FIG. 8). Accordingly, the front edge 42A of molding guide kit 42, inner edge 26B1 of mold chase 26, and sidewall 52A in combination may form a substantially full circle.

Furthermore, as shown in FIG. 8, the inner edge 26B1 of edge ring 26B includes portions on the opposite sides of venting blocker 52. These portions (marked as 26B1') of the inner edge 26B 1 are also curved.

Referring back to FIG. 1, injection port 30 and venting port 32 are formed as the openings on edge ring 26B, wherein injection port 30 and venting port 32 connect the inner space of mold chase 26 to the outer space outside of mold chase 26.

FIG. 2 illustrates the insertion of a part of molding compound dispensing kit 40 into injection port 30. After the insertion of molding guide kit 42 into injection port 30, injection port 30 is essentially sealed by molding compound dispensing kit 40. For example, the top surfaces of the edge portions 42B (FIGS. 7B and 7C) of molding guide kit 42 may be in contact with the bottom surface of release film 27 when molding guide kit 42 is inserted into injection port 30. The position of front edge 42A fits the inner sidewall 26B1 (not visible in FIG. 2, refer to FIG. 8) of edge ring 26B to form a circle. At this time, venting port 32 is open.

Next, the inner space of mold chase 26 is vacuumed through venting port 32. The pressure of the inner space of mold chase 26 may be lower than about 1 torr or lower than about 100 mtorr in some embodiments. At the venting port 32, venting blocker 52 is lifted up so that venting port 32 is open and the air in the inner space of mold chase 26 can be extracted.

Figure 3:
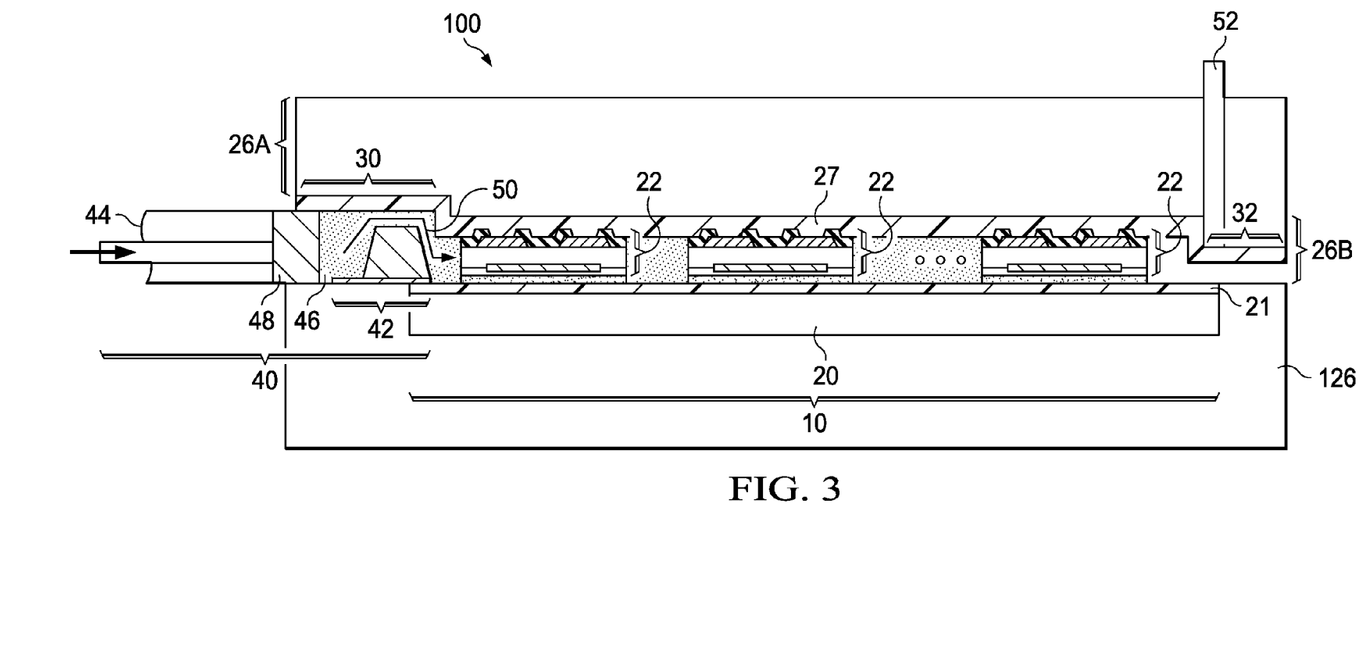

When the pressure of the inner space of mold chase 26 is reduced to a pre-determined level, for example, lower than about 1 torr or 100 mtorr, the molding of package structure 10 is started. Piston 48 is pushed forward to push molding material 46 into the inner space of mold chase 26. Molding material 46 flows through the streets (FIG. 8) between device dies 22 and flows toward venting port 32, as shown in FIG. 3. At the injection port 30, molding material 46 flows in the direction shown by arrow 50. For example, molding material 46 first flows upwardly over molding guide kit 42, and then downwardly along the front edge 42A, and into the main street 24 (FIG. 8). From main street 24 as in FIG. 8, molding material 46 spreads to all other streets between device dies 22.

Referring to FIG. 4, at a time when the front end of molding material 46 is close to venting port 32, for example, when the front end of molding material 46 reaches the device die 22 that is closest to venting port 32, venting blocker 52 is pushed down to block venting port 32. Release film 27, which is flexible, is also pushed down. The blocking of venting port 32 will prevent molding material 46 from flowing into venting port 32. As shown in FIG. 8, after venting blocker 52 is pushed down, the inner space of mold chase 26 is defined by mold chase 26, the front edge 42A, and sidewall 52A of venting blocker 52, and hence has a full circular top-view shape.

Figure 5:
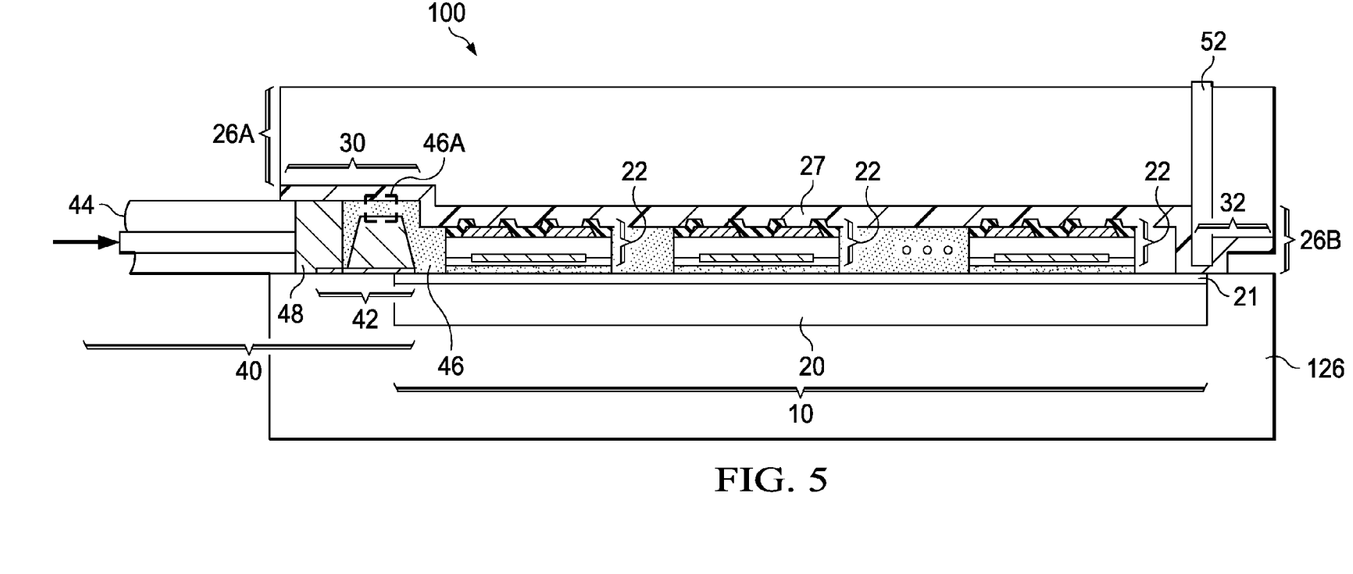

Since the inner space of mold chase is vacuumed, after venting blocker 52 blocks venting port 32, with piston 48 continuing to be pushed forward, molding material 46 continually flows forward until all the inner space of mold chase 26 is filled with molding material 46. The resulting structure is illustrated in FIG. 5. Afterwards, molding material 46 is cured in a, for example, thermal curing process, and molding material 46 is solidified.

Figure 11:
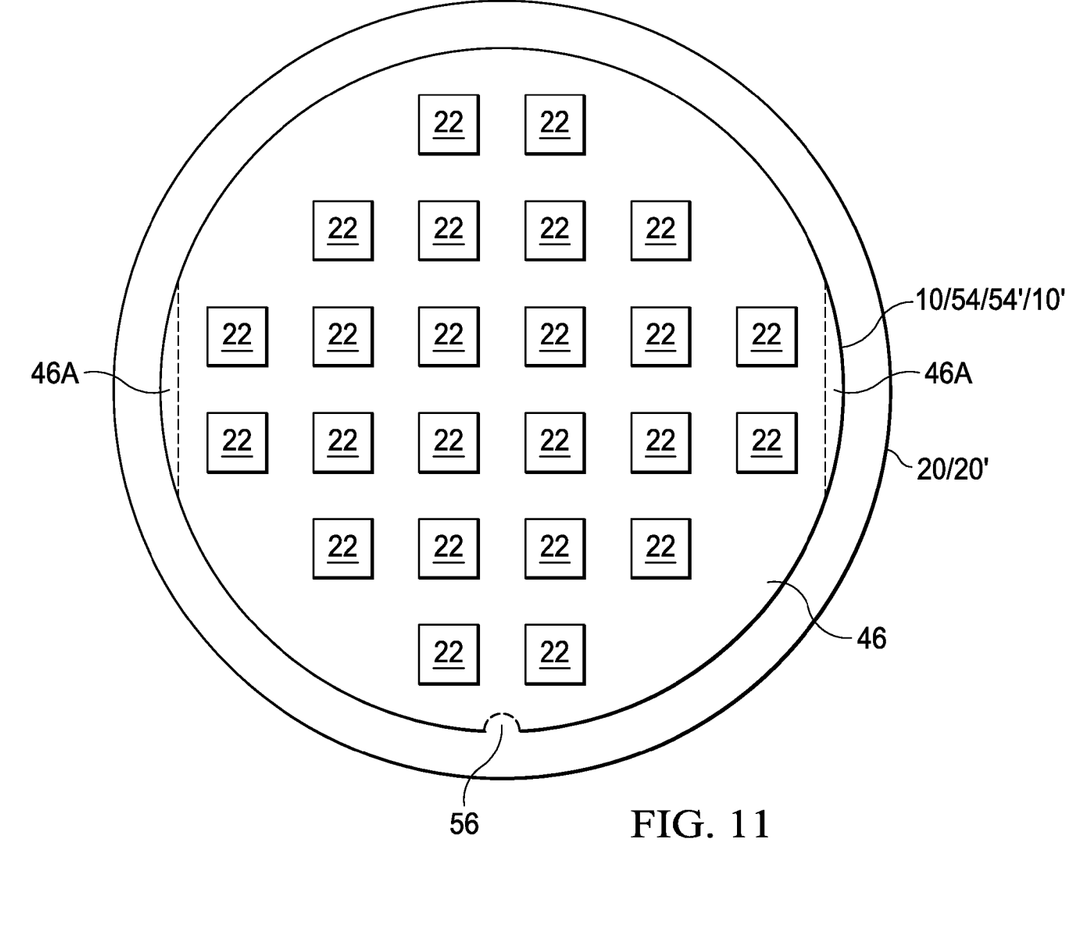
FIGS. 11 through 13 illustrate the top view and the cross-sectional views of an exemplary composite wafer formed through the wafer-level transfer molding process in accordance with some embodiments.
Figure 12:
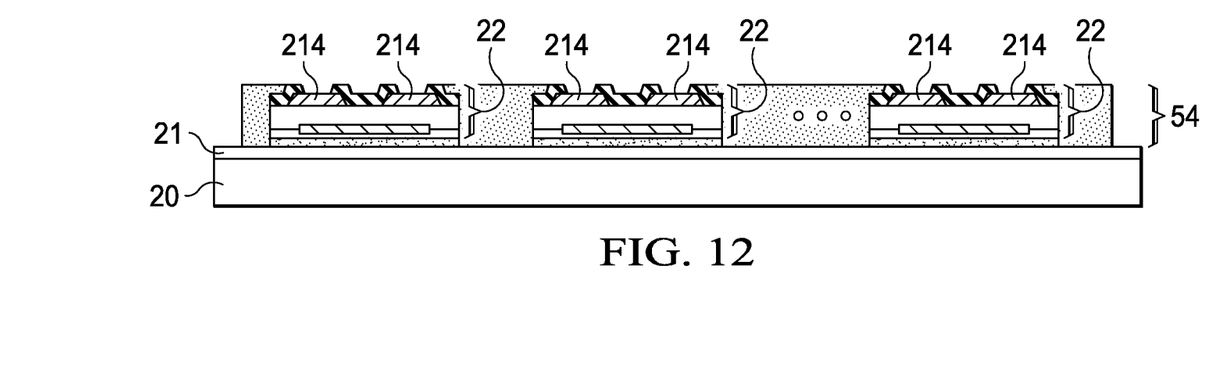

After the solidification of molding material 46, molding chase 26 is removed from the molded package structure 10 along with molding compound dispensing kit 40 and venting blocker 52. Release film 27 is also removed. An advantageous feature of using molding guide kit 42 in accordance with the embodiments is that, at injection port 30, a thin molding layer 46A is formed to connect to the main portion of molding material 46, wherein the main portion has a round top-view shape. The thin molding compound portion 46A can be easily broken during or after the removal of molding compound dispensing kit 40 without damaging the main portion of molding material 46. The resulting molded package structure 10 is shown in FIG. 11. Throughout the description, the structure including device dies 22 and molding material 46 is referred to as composite wafer 54. A cross-sectional view of composite wafer 54 is shown in FIG. 12. In subsequent steps, composite wafer 54 is treated as a wafer, and redistribution lines (not shown) may be formed to connect to electrical connectors 214. The redistribution lines may overlap molding material 46 to form a fan-out structure.

Figure 6:
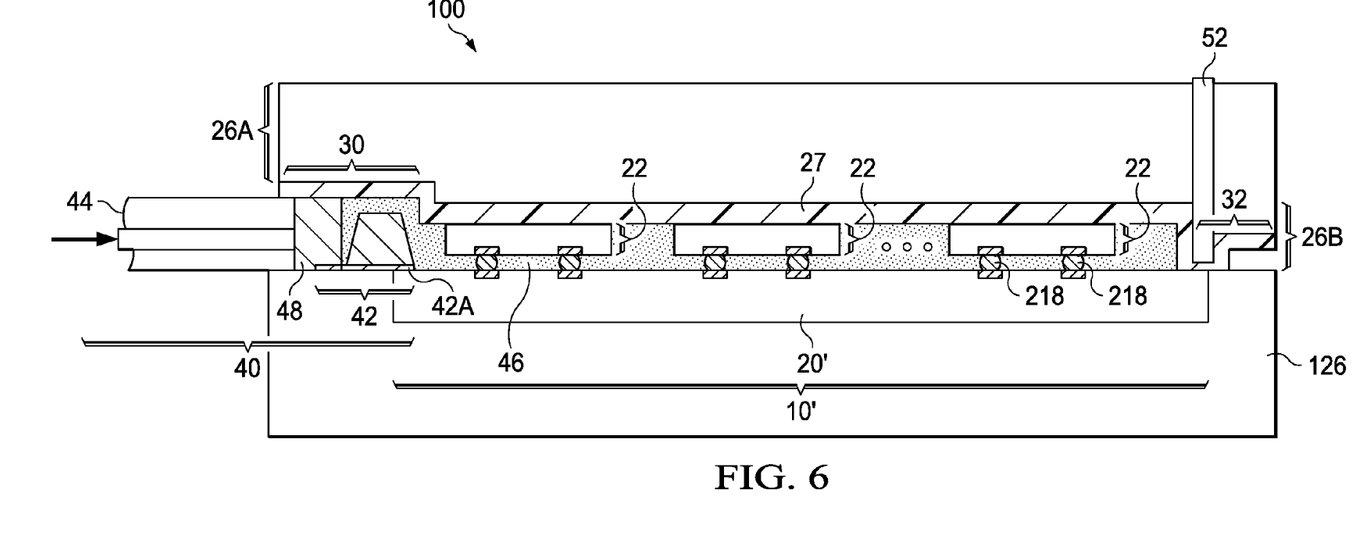
FIG. 6 illustrates the cross-sectional view of an intermediate stage in a wafer-level transfer molding process in accordance with some other embodiments.

FIG. 6 illustrates the molding of package structure 10' in accordance with alternative embodiments. In these embodiments, carrier 20' is a wafer such as a device wafer, which includes a plurality of device chips including active devices (such as transistors) therein. The device wafer 20' may also include passive devices such as resistors, capacitors, inductors, and/or transformers therein. Carrier 20' may also include a semiconductor substrate (not shown) such as a silicon substrate, a silicon germanium substrate, a silicon carbon substrate, or a III-V compound semiconductor substrate. In alternative embodiments, carrier 20' is an interposer wafer, which is free from active devices therein. In the embodiments where carrier 20' is an interposer wafer, carrier 20 may also include a semiconductor substrate. The interposer wafer 20' may or may not include passive devices such as resistors, capacitors, inductors, and/or transformers therein. The top view of carrier 20' may be rounded, for example, as shown in FIG. 8.

In these embodiments, device dies 22 are bonded to the dies in wafer 20' through flip-chip bonding. Device dies 22 may have essentially the same structure as shown in FIG. 1. In accordance with some embodiments, the bonding is through solder regions 218. In alternative embodiments, device dies 22 are bonded to wafer 20' through direct metal bonding such as copper-to-copper bonding. The back surfaces of device dies 22, which may also be the back surfaces of the semiconductor substrates of device dies 22, are in contact with release film 27.

Figure 13:
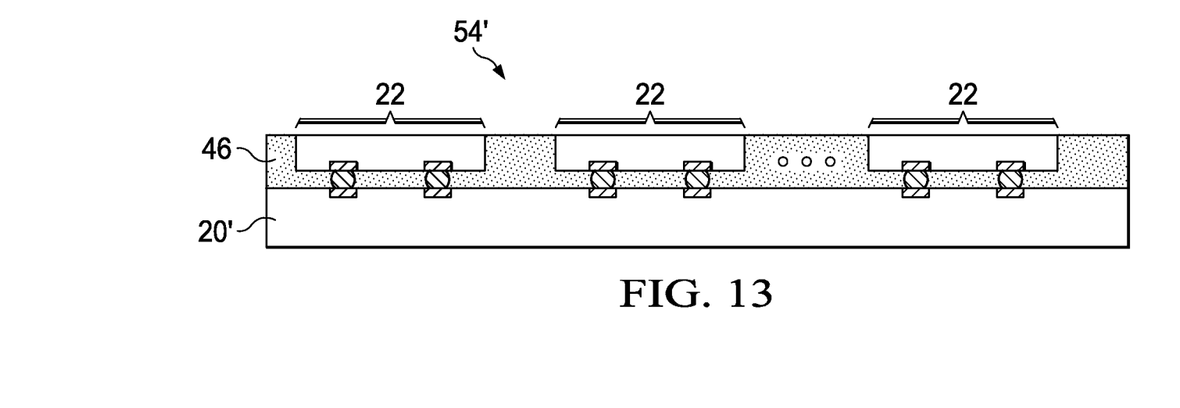

The molding process in accordance with these embodiments is essentially the same as shown in FIGS. 1 through 5, and the details of the molding of package structure 10' is not discussed herein. The resulting composite wafer 54', which includes device wafer 20', device dies 22 bonded to device wafer 20', and molding material 46, is illustrated in FIG. 13. Since the back surfaces of device dies 22 are exposed through (not covered by) molding material 46, no additional process step is needed to grind molding material 46, and hence the manufacturing cost is saved.

FIG. 11 illustrates a top view of composite wafer 54 or 54' in accordance with some embodiments of the present disclosure. As shown in 11, the outer edge of composite wafer 54/54', which is the outer edge of molding material 46, is a full circle, and composite wafer 54/54' is a rounded wafer. Accordingly, the production tools that handle silicon wafers may also handle composite wafer 54/54', and hence additional integrated manufacturing processes such the formation of redistribution lines may be performed on composite wafer 54/54' without requiring the production tools to be modified. As a comparison, if the outer edge of molding guide kit 42 (FIGS. 7B and 7C) is straight, portions 46A of molding material 46 will not exist. Consequently, fewer device dies 22 can be molded, resulting in yield lost. Furthermore, since the resulting composite wafer is not rounded, the production tools may not be able to handle composite wafers that have straight edges.

To align composite wafer 54/54' (FIG. 11), notch 56 may be formed in composite wafer 54/54'. Notch 56 may be formed at the edge of composite wafer 54/54'. In accordance with some embodiments, notch 56 is offset from main street 24 (FIG. 8) of package structure 10. Alternatively stated, notch 56 is misaligned from the line that connects injection port 30 to venting port 32. As shown in FIG. 8, notch 56 may be aligned to diameter 58. In accordance with some exemplary embodiments, diameter 58 is perpendicular to diameter 25, which is the diameter that connects injection port 30 to venting port 32. In alternative embodiments, notch 56 may be formed at any other position misaligned from diameters 25 and 58. Making notch 56 misaligned from diameter 25 will eliminate the likelihood of blocking the flow of molding material 46 in the molding process.

Figure 9:
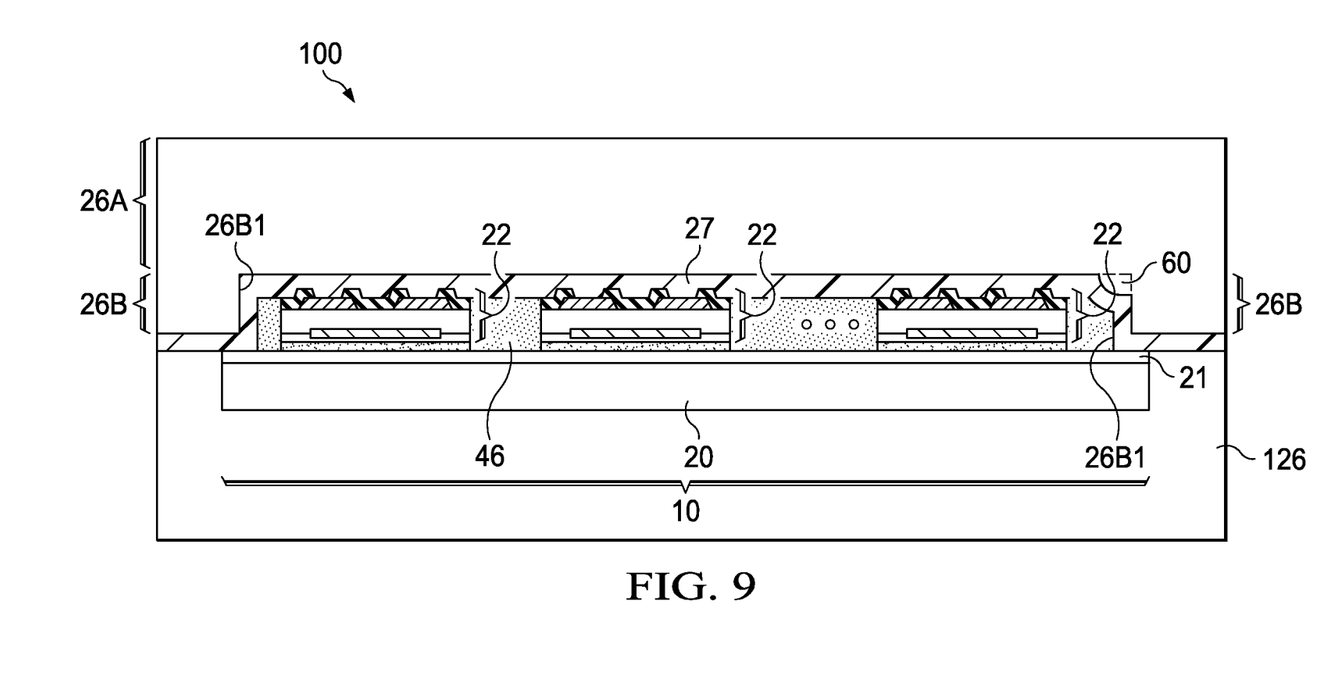
FIG. 9 illustrates the cross-sectional view of a molding process in accordance with some embodiments, wherein a notch is formed in the resulting molding compound.

The formation of notch 56 may be illustrated as in FIG. 9, which shows a cross-sectional view obtained from the plane containing line 9-9 in FIG. 8. To form notch 56, mold chase 26 includes protrusion 60, which may be formed at the joint of top portion 26A and edge ring 26B of mold chase 26. Release film 27 covers protrusion 60 and also protrudes into the inner space of mold chase 26. As a result, notch 56 is formed in the resulting molding material 46 after the molding process is finished.

Before the molding process in accordance with the embodiments of the present disclosure is used in mass production, the process parameters of the molding process need to be tuned. The process parameters may include, and are not limited to, the pushing speed of piston 48 (FIG. 4), the viscosity of molding material 46, the optimum time between the starting time of injecting molding compound, and the time to push down venting blocker 52 (FIG. 4), etc. In the tuning of the process parameters, pressure sensors are mounted in mold chase 26 to detect the pressure. For example, FIG. 8 illustrates two exemplary pressure sensors 62 that are used in the tuning of the process parameters. In accordance with some embodiments, pressure sensors 62 are located symmetric to the center of package structure 10, as shown in FIG. 8. In alternative embodiments, pressure sensors 62 may be placed in locations that are asymmetric.

Figure 10:
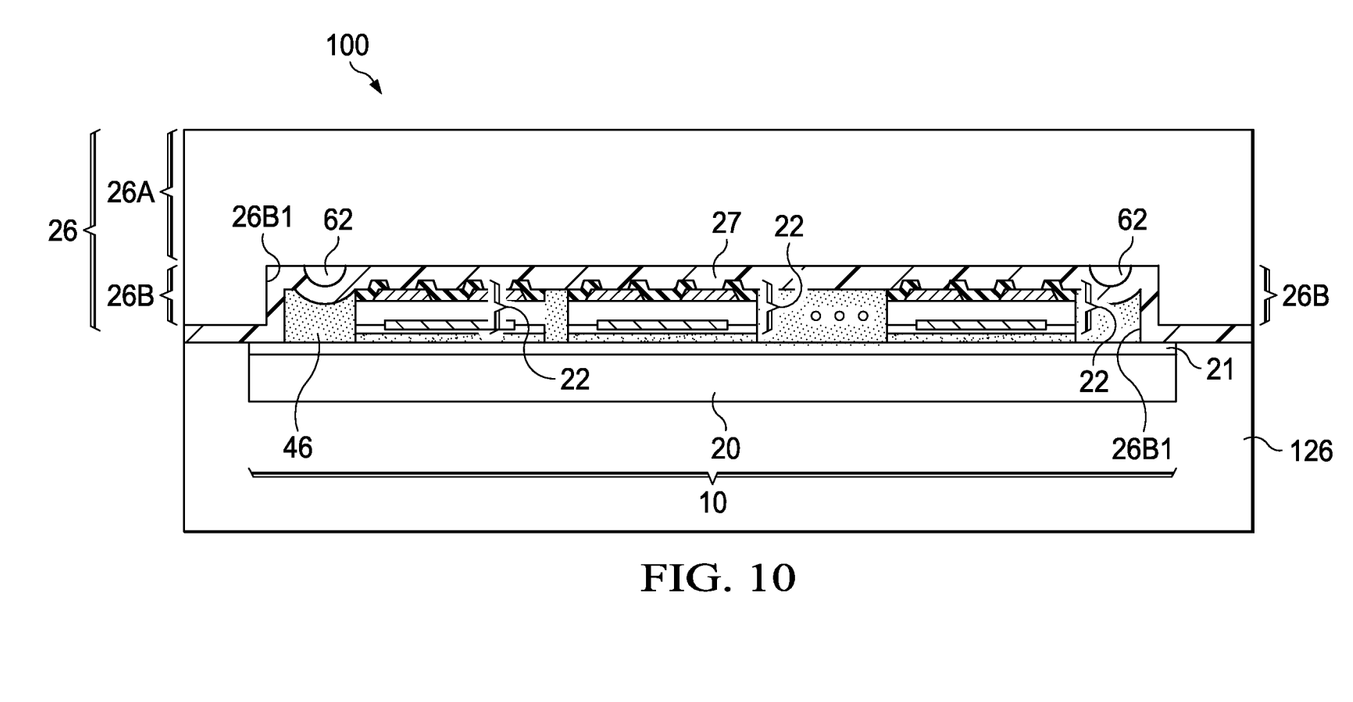
FIG. 10 illustrates pressure sensors used in a wafer-level transfer molding process in accordance with some embodiments.

FIG. 10 illustrates a cross-sectional view of the structure shown in FIG. 8, wherein the cross-sectional view is obtained from the plane crossing line 10-10 in FIG. 8. As shown in FIG. 10, pressure sensors 62 may be attached to the bottom surface of the top portion 26A of mold chase 26. Release film 27 covers pressure sensors 62 so that pressure sensors 62 do not stick to molding material 46. Furthermore, pressure sensors 62 are not directly over dies 22 so that pressure sensors 62 may be used to detect the pressure of the molding material. In some exemplary embodiments, pressure sensors 62 may be used to detect when molding compound 46 flows to pressure sensors 62. During the mass production of composite wafer 54/54' of real products, pressure sensors 62 may be removed from mold chase 26.

The embodiments of the present disclosure have some advantageous features. By designing the front edge of the molding guide kit as curved, the resulting composite wafer formed in the corresponding molding process has a fully rounded edge, the same as typical silicon wafers. Advantageously, the resulting composite wafer may be handled the same way as typical silicon wafers without additional process difficulty. Furthermore, by curving the front edge of the molding guide kit, it is possible to mold some extra device dies in, and hence the yield of the molding process is improved.

In accordance with some embodiments of the present disclosure, an apparatus includes a mold chase, which includes a top portion and an edge ring having a ring-shape. The edge ring is underlying and connected to an edge of the top portion. The edge ring has an injection port and a venting port. A molding guide kit is configured to be inserted into the injection port. The molding guide kit includes a front sidewall having a curved front edge.

In accordance with alternative embodiments of the present disclosure, an apparatus includes a mold chase having an edge ring having a ring-shape. The edge ring has an injection port, and a venting port aligned to a diameter of the edge ring. The injection port and the venting port connect an inner space encircled by the edge ring to a space outside of the edge ring. A molding guide kit is configured to be inserted into the injection port. The molding guide kit has a channel connected to the inner space, and a front sidewall facing the inner space, wherein the front sidewall is curved.

In accordance with yet alternative embodiments of the present disclosure, a method includes placing a release film on an inner surface of a mold chase, wherein the mold chase includes a top portion and an edge ring having a ring-shape. The edge ring is underlying and connected to an edge of the top portion. The edge ring includes an injection port and a venting port. The method further includes placing the mold chase and the release film over a package structure, with the edge ring encircling the package structure. A molding guide kit is into the injection port, wherein the molding guide kit includes a channel connected to an inner space encircled by the edge ring, and a front sidewall facing the inner space, with the front sidewall having a curved front edge aligned to an inner edge of the edge ring of the mold chase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a mold chase comprising:
     a top portion; and
     an edge ring having a ring-shape, wherein the edge ring is underlying and connected to an edge of the top portion, and wherein the edge ring comprises an injection port and a venting port; and
   a molding guide kit comprising:
     a storage configured to store a molding material therein; and
     a piston configured to push the molding material stored in the storage into the mold chase, wherein the molding guide kit comprising the storage and the piston is configured to be inserted into the injection port.

2. The apparatus of claim 1, wherein the edge ring comprises an inner edge facing an inner space encircled by the edge ring, wherein the edge ring has a first radius, and wherein a curved front edge of a front sidewall of the molding guide kit has a second radius substantially equal to the first radius.

3. The apparatus of claim 2, wherein the molding guide kit is configured to have the curved front edge aligned to the inner edge of the edge ring with the molding guide kit in the injection port.

4. The apparatus of claim 1, wherein the molding guide kit comprises a front sidewall having a curved front edge, and wherein the front sidewall of the molding guide kit is a slanted sidewall.

5. The apparatus of claim 1, wherein the molding guide kit comprises a separator configured to separate a flowing channel of the molding material into sub-channels.

6. The apparatus of claim 1, wherein the mold chase further comprises a protrusion at a joint of the top portion and the edge ring of the mold chase, and the protrusion is misaligned from a diameter of the mold chase connecting the injection port to the venting port.

7. The apparatus of claim 1, wherein the molding guide kit is configured to seal the injection port.

8. An apparatus comprising:
 a mold chase comprising:
  an edge ring having a ring-shape, wherein the edge ring comprises:
  an injection port; and
  a venting port, wherein the injection port and the venting port are aligned to a diameter of the edge ring, and wherein the injection port and the venting port connect an inner space encircled by the edge ring to a space outside of the edge ring; and
 a molding guide kit configured to be inserted into the injection port, wherein the molding guide kit comprises:
  a channel connected to the inner space;
  at least one separator separating the channel into a plurality of sub-channels; and
  a front sidewall facing the inner space, wherein the front sidewall is curved.

9. The apparatus of claim 8 further comprising a venting blocker configured to block the venting port, wherein the venting blocker comprises a curved inner sidewall facing the inner space.

10. The apparatus of claim 9, wherein the curved inner sidewall of the venting blocker is aligned to an inner edge of the edge ring, with the inner sidewall of the venting blocker and the inner edge of the edge ring having a substantially same radius.

11. The apparatus of claim 9, wherein portions of an inner edge of the edge ring on opposite sides of the venting port are curved.

12. The apparatus of claim 8, wherein the channel comprises a shallow portion and a deep portion deeper than the shallow portion, wherein the deep portion is connected to the shallow portion.

13. The apparatus of claim 8, wherein the mold chase further comprises:
 a top portion, with the edge ring connected to a round edge of the top portion; and
 a protrusion at a joint of the top portion and the edge ring of the mold chase, wherein the protrusion is misaligned from the diameter connecting the injection port to the venting port.

14. The apparatus of claim 8, wherein the molding guide kit further comprises:
 a storage configured to store a molding material therein; and
 a piston configured to push the molding material stored in the storage into the mold chase, wherein the molding guide kit is configured to be inserted into the injection port.

15. A apparatus comprising:
 a mold chase comprising:
  a top portion having a circular top-view shape; and
  an edge ring underlying and connected to the top portion, wherein the edge ring has an injection port; and
 a discrete molding guide kit configured to be inserted into, and fitting, the injection port, wherein the discrete molding guide kit has a front end aligned to an inner edge of the edge ring when the discrete molding guide kit is inserted into the injection port, and the discrete molding guide kit comprises:
  edge portions;
  a channel between the edge portions, wherein the channel is connected to an inner space encircled by the edge ring when the discrete molding guide kit is inserted into the injection port; and
  a separator separating the channel into a plurality of sub-channels.

16. The apparatus of claim 15, wherein the discrete molding guide kit further comprises a separator in the channel, and the separator separates a front end portion of the channel into at least two sub-channels.

17. The apparatus of claim 15, wherein a front edge of the apparatus has a curvature substantially equal to a curvature of an inner edge of the edge ring.

18. The apparatus of claim 15, wherein the channel comprises a shallow portion and a deep portion deeper than the shallow portion.

19. The apparatus of claim 15, wherein the edge portions of the discrete molding guide kit have heights substantially equal to a height of injection port.

20. The apparatus of claim 15, wherein the channel has a front portion and a back portion, with the front portion being closer to the inner space than the back portion, and the front portion becomes wider approaching the front end of the discrete molding guide kit.

* * * * *